United States Patent [19]
Hicks

[11] Patent Number: 4,789,843
[45] Date of Patent: Dec. 6, 1988

[54] LASER DIODE OPTICAL MODULATING DEVICES

[76] Inventor: John W. Hicks, 312 Howard St., Northboro, Mass. 01532

[21] Appl. No.: 78,599

[22] Filed: Jul. 28, 1987

[51] Int. Cl.[4] .................................... H01L 31/02
[52] U.S. Cl. ................................ 332/7.51; 350/356
[58] Field of Search ............... 332/7.51; 350/96.14, 350/356; 455/602; 377/102

[56] References Cited

U.S. PATENT DOCUMENTS

| | | | |
|---|---|---|---|
| 3,301,625 | 1/1967 | Ashkin et al. | 332/7.51 |
| 3,462,711 | 8/1969 | Nelson | 332/7.51 |
| 3,480,347 | 11/1969 | Walter et al. | |
| 3,518,574 | 6/1970 | Rutz | 332/7.51 |
| 3,519,328 | 7/1970 | Grossman | 350/356 |
| 3,588,749 | 6/1971 | Meyer | 332/7.51 |
| 3,691,483 | 9/1972 | Klein | 350/356 X |
| 3,724,926 | 4/1973 | Lee | 332/7.51 |
| 3,748,597 | 7/1973 | Reinhart | 332/7.51 |
| 3,842,372 | 10/1974 | Pao et al. | 350/356 X |
| 3,900,246 | 8/1975 | Kimura et al. | 350/356 X |
| 3,953,810 | 4/1976 | Veilex | 332/7.51 |
| 4,103,260 | 7/1978 | Buchman | 332/7.51 |
| 4,399,418 | 8/1983 | Forrester | 332/7.51 |
| 4,518,934 | 5/1985 | Venkatesan | 332/7.51 |
| 4,525,687 | 6/1985 | Chemla et al. | 332/7.51 |

OTHER PUBLICATIONS

"Optics", Hech et al., Feb. 1979, pp. 482–485, Addison-Wesley pub.

*Primary Examiner*—Thomas H. Tarcza
*Assistant Examiner*—Mark Hellner
*Attorney, Agent, or Firm*—Wolf, Greenfield & Sacks

[57] ABSTRACT

An optical modulator for modulating a light beam includes a laser diode having an active region with optically flat faces at opposite ends thereof. The modulator is constructed so that oscillation of the laser diode is suppressed and a time-varying electrical modulation signal is applied to the active region. An optical isolator includes a first electronically controlled optical switch coupled to the isolator input, a second electronically controlled optical switch coupled to the isolator output and means for optical coupling between the first switch and the second switch and having associated delay $T_0$. Square wave actuation signals are applied to the first and second switches. The square wave signals each have a cycle time $T_p = 4T_0$ and the square wave signal applied to the second switch is delayed relative to the square wave signal applied to the first switch by a time $T_0$. A single channel isolator provides a 50% duty cycle output, while a two-channel isolator having control signals delayed by one half cycle provides 100% duty cycle output. The isolator control signals can be gated with a modulation signal to provide both modulating and isolating functions.

14 Claims, 5 Drawing Sheets

LASER DIODE OPTICAL MODULATING DEVICES

FIELD OF THE INVENTION

This invention relates to light beam modulators, isolators and switching devices and, more particularly, to such devices utilizing laser diodes in a manner to suppress oscillations so as to permit modulation of a light beam by applying a time-varying electrical signal to the laser diode.

BACKGROUND OF THE INVENTION

In an optical communication system, it is necessary to provide a light source which is spectrally narrow and stable in frequency. It is further necessary to modulate the light beam without adversely affecting the source frequency or spectral line width.

Solid state laser diode oscillators are frequently used as the source of a light beam for optical fiber systems. The output of a laser diode oscillator may be stabilized by an external resonant cavity. It is known to modulate laser diode oscillators by turning the laser diode on and off. Such modulation tends to perturb both the frequency and the line width of the laser diode output. Although the modulation inherently produces a broadening of the laser diode output, the modulation produces perturbations which are well in excess of that expected by a Fourier transformed analysis of the modulation signal. Thus, a need has arisen for improved optical modulation techniques.

In any optical communication system, reflection of power back into a laser source, particularly a laser diode oscillator, alters the oscillator frequency appreciably, and variable reflection creates frequency instability. For this reason, unidirectional devices called optical isolators are used to prevent light power from returning to the laser source. Prior art optical isolators have included two rotated polarizers separated by means for rotating the plane of polarization with a magnetic field. The plane of polarization for a forward light beam is rotated to pass through both polarizers, while the plane of polarization of a beam passing in the reverse direction is rotated in such a way that the beam is blocked. These devices require a polarized light beam for proper operation and are relatively expensive.

It is a general object of the present invention to provide an improved optical modulator.

It is another object of the present invention to provide an improved optical isolator.

It is a further object of the present invention to provide a modulated optical source including a light source and a separate optical modulator.

It is a further object of the present invention to provide a laser diode modulator in which oscillations are suppressed.

It is yet another object of the present invention to provide an optical isolator for unidirectional optical transmission which is independent of polarization.

It is still another object of the present invention to provide a modulated optical source including an isolation feature which prevents reverse light beams from reaching the optical source.

It is yet another object of the present invention to provide an optical modulator which is relatively low in cost.

It is yet another object of the present invention to provide a modulated optical source wherein the modulation does not appreciably affect the frequency or spectral line width of the source.

SUMMARY OF THE INVENTION

According to the present invention, these and other objects and advantages are achieved in an optical modulator for modulating a light beam. The modulator comprises a laser diode having an active region with optically flat faces at opposite ends thereof, the laser diode being oriented so that the light beam passes through the optically flat faces and through the active region. The modulator further comprises means for suppressing oscillation of the laser diode and means for applying a time varying electrical modulation signal to the active region for modulating the light beam.

In a preferred embodiment of the modulator, the active region defines an optical waveguide having a longitudinal axis between opposite ends thereof and the oscillation suppressing means comprises the optically flat faces being oriented relative to the axis at an angle other than 90°. The angle between the optically flat faces and the axis preferably exceeds the capture angle of the optical waveguide. In another embodiment, the oscillation suppressing means comprises an anti-reflective coating on the optically flat faces. The gain of the active region, the transmission of the waveguide and the transmission and reflection characteristics of the optically flat faces are selected to provide desired transmission ratios between on and off states and desired values of gain in on and off states. Preferably, the transmission ratio between on and off states exceeds 10.

According to another aspect of the invention, a modulated optical source includes source means for generating a light beam, an optical modulator for modulating the light beam in response to a time-varying electrical modulation signal and means for coupling the light beam from the source means to the modulator. The optical modulator comprises a laser diode having an active region with optically flat faces at opposite ends thereof, means for suppressing oscillation of the laser diode and means for applying a time-varying electrical signal to the active region. The light beam is coupled to the laser diode so that it passes through the optically flat faces and through the active region and is modulated by the modulation signal. Preferably, the source means comprises a laser diode source for generating a spectrally narrow light beam.

According to yet another aspect of the present invention, there is provided an optical isolator for transmitting a forward light beam from an input to an output and for blocking a reverse light beam from passing from the output to the input. The optical isolator comprises first electronically controllable optical switching means coupled to the isolator input, second electronically controllable optical switching means coupled to the isolator output, means for optical coupling between the first switching means and the second switching means and having an associated delay, $T_0$, and means for providing a first square wave actuation signal to said first switching means and for providing a second square wave actuation signal to said second switching means, said first and second square wave signals each having a cycle time $T_p = 4T_0$, and said second square wave signal being delayed relative to said first square wave signal by a time $T_0$. Preferably, the first switching means and the second switching means each comprise a laser diode modulator as described above.

The first switching means and the second switching means comprise a single channel optical isolator having a 50% duty cycle output. A second channel coupled in parallel with the first channel and having its control signals delayed by one-half cycle provides 100% duty cycle operation. A modulation signal can be gated with the control signals to provide a modulated isolator. Preferably, the first switching device in each channel has relatively low gain and the second switching device in each channel has relatively high gain to limit inadvertent reflections back to the light source.

According to still another aspect of the present invention, a modulated optical source for providing a light beam modulated by a digital modulation signal comprises source means for generating the light beam and a unidirectional optical modulator having an input for receiving the light beam from the source means, and an output. The modulator comprises a first channel including a first electronically controllable optical switching means coupled to the modulator input, a second electronically controllable optical switching means coupled to the modulator output and first coupling means for optical coupling between the first and second switching means and having an associated delay $T_0$; and a second channel coupled in parallel with the first channel between the modulator input and output and including a third electronically controllable optical switching means coupled to the modulator input, a fourth electronically controllable optical switching means coupled to the modulator output and second coupling means for optical coupling between the third and fourth switching means and having an associated delay $T_0$. The modulator further includes means for providing a first square wave signal to the first switching means, a second square wave signal to the second switching means, a third square wave signal to the third switching means and a fourth square wave signal to the fourth switching means. The square wave signals each have a cycle time $T_p=4T_0$. The third square wave signal is delayed relative to the first square wave signal by one-half cycle time $T_p/2$, and the second and fourth square wave signals are delayed relative to the first and third square wave signals, respectively, by $T_0$. The modulator further includes means for gating the digital modulation signal with the first square wave signal and with the third square wave signal so that the first switching means is on only when the digital modulation signal and the first square wave signal are active, and the third switching means is on only when the digital modulation signal and the third square wave signal are active.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
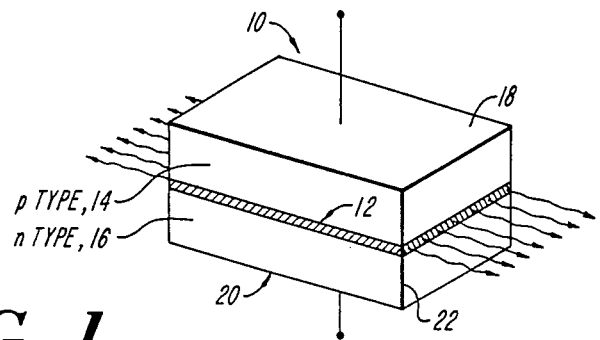
FIG. 1 is a simplified pictorial view of a laser diode in accordance with the prior art.

A laser diode 10 in accordance with the prior art is shown in FIG. 1. An active region 12, typically comprising gallium arsenide is sandwiched between a p type region 14 and an n type region 16, and electrical contacts 18, 20 are applied to regions 14, 16, respectively. Opposite ends of the active region 12 have optically flat and parallel faces 22. When an electrical current is passed through the device between contacts 18 and 20, stimulated optical emission occurs in active region 12, and a coherent light beam is emitted from faces 22. In a typical device, the active region may be a centrally located strip extending between optically flat faces 22, rather than a layer as shown in FIG. 1.

Figure 2:
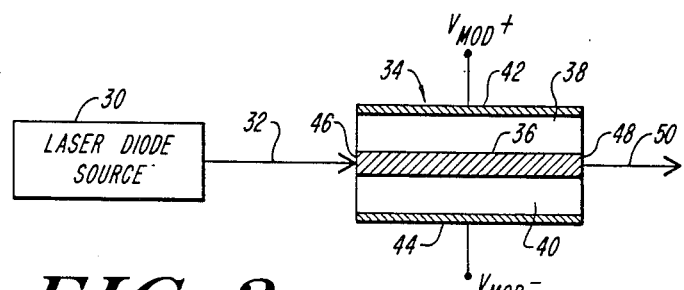
FIG. 2 is a block diagram of a modulated optical source in accordance with the present invention.

In accordance with the present invention, a laser diode is utilized as a modulator by suppressing oscillations and applying an electrical modulation voltage to the terminals which normally bias the active region for oscillation. A laser diode modulator utilized with a separate laser diode source is illustrated in FIG. 2. A laser diode source 30 supplies a spectrally narrow light beam 32, typically through an optical fiber, to a laser diode modulator 34. The laser diode modulator 34 includes an active region 36 which can be any of the well-known gallium arsenide compounds typically utilized in laser diodes. The active region 36 is sandwiched between a p type region 38 and an n type region 40. Electrical contacts 42, 44 are attached to the regions 38, 40, respectively, for application of electrical modulation signals. Opposite end faces 46, 48 of active region 36 are optically flat to permit coupling of a light beam to and from the laser diode modulator 34. As described hereinafter, end faces 46, 48 can be disposed at an angle to the longitudinal axis of active region 36 to suppress oscillations. In another embodiment, the laser diode source 30 can be replaced with a neodymium-doped optical fiber laser source.

The laser diode 34 is fabricated so as to suppress the normally-desired oscillations. The light beam 32 from the source 30 is directed at end face 46 and passes through active region 36 and exits from end face 48 as a light beam 50. A modulation voltage $V_{MOD}$ is applied between contacts 42 and 44, causing a modulation of the light beam as it passes through active region 36, and the exiting light beam 50 is modulated. Since the modulation and light generating functions are separated, perturbation of the frequency and spectral width of the source is substantially reduced.

Figure 3:
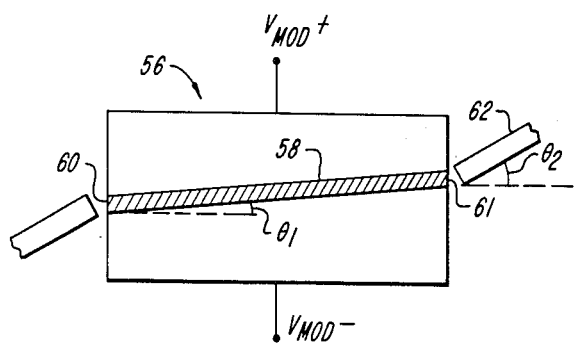
FIG. 3 is a simplified diagram of a laser diode modulator having angled, optically flat end faces to suppress oscillation.

One technique for suppressing oscillations is shown in FIG. 3. A laser diode modulator 56 is fabricated with an active region 58 having a longitudinal axis oriented at an angle $\theta_1$ other than 90° with respect to end faces 60, 61. Preferably, the angle $\theta_1$ is greater than the capture angle, or critical angle, of the optical waveguide defined by active region 58. Internal reflections from end faces 60, 61 do not propagate back through the cavity defined between end faces 60 and 61, and the tendency for oscillation is suppressed. Another technique for suppressing oscillation is to coat end faces 60, 61 with an anti-reflective coating. The anti-reflective coating can be used separately or in combination with the angled end faces 60, 61 in order to suppress oscillation.

It is known that reflections outside a laser resonant cavity can reflect light back into the cavity, creating an undesired secondary resonant cavity. Such a secondary resonant cavity can oscillate and perturb the operation of the laser diode modulator of the present invention. To prevent such reflections, a fiber 62 used to couple light from laser diode modulator 56 is oriented with its end face at an angle $\theta_2$ greater than angle $\theta_1$ in order to suppress such reflections.

In order to prevent oscillations in the laser diode modulator, it is necessary that the round trip net gain be less than unity. The round trip net gain can be defined as $T^2 R_1 R_2 G^2$, where T is the internal transmission of the waveguide, $R_1$ and $R_2$ are the reflection coefficients of end faces 60 and 61 and G is the gain of the active region 58. For acceptable modulator performance, the ratio between net transmission gains in the on and off states of the modulator should be in excess of 10. Since the gain G is approximately unity when the modulator is off, the gain must be 10 or more in the on state. Thus, in order to suppress oscillation, $R_1 = R_2 \leq 0.1$. For net transmission ratios between on and off states of 100, the reflection coefficients $R_1$ and $R_2$ must be less than 0.01.

With reference to FIG. 2, it will be understood that the laser diode source 30 can be either close to, or remote from, the laser diode modulator. For example, when utilized in a telecommunications system, the laser diode source may be located in a central office, and the modulator may be located in a home, the two being coupled by an optical fiber.

As noted above, reflection of power back to a laser source, particularly a laser diode oscillator, alters the oscillator frequency appreciably and variable reflection creates frequency instability. To overcome this problem, optical isolators are used to prevent power from returning to the laser source. With reference to FIG. 2, a conventional optical isolator, utilizing a pair of polarizers and a material which varies polarization in response to a magnetic field, can be placed in the optical path between the source 30 and the laser diode modulator 34.

According to another aspect of the invention, the laser diode modulator shown in FIGS. 2 and 3 and descried hereinabove is utilized to provide an optical isolator. As used herein, the term optical isolator means a device or apparatus which transmits a forward light beam from an input to an output, but which blocks a return or reverse light beam from passing from the output to the input. Therefore, reflections from various system elements are prevented from reaching the source and causing instability.

Figure 4A:
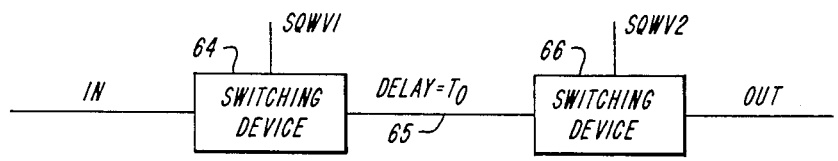
FIG. 4A is a block diagram of an optical isolator in accordance with the present invention.
Figure 4B:
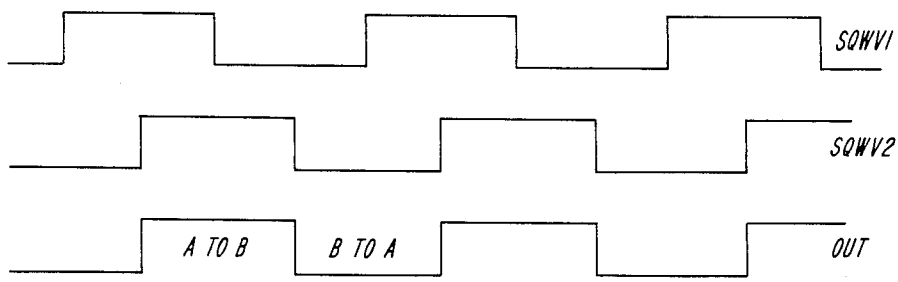
FIG. 4B illustrates waveforms associated with the operation of the optical isolator shown in FIG. 4A.

An optical isolator in accordance with the present invention utilizing time gating of an input light beam is shown in FIG. 4A. The waveforms for the isolator are shown in FIG. 4B. An input light beam is coupled to the input of an electronically controlled optical switching device 64. The output of switching device 64 is coupled by an optical fiber 65 to the input of an electronically controlled optical switching device 66. The output of switching device 66 is the isolator output. The switching devices 64, 66 can be any suitable optical switching device, but are preferably a laser diode modulator as shown in FIGS. 2 and 3 and described hereinabove.

Each switching device 64, 66 includes a control lead to which is applied a control ssignal. In order to provide optical isolation, the control signals are timed as described hereinafter. The control signal for switching device 64 is designated as SQWV1, while the control signal for switching device 66 is designated as SQWV2. The optical fiber 65 interconnecting switching devices 64 and 66 has an associated propagation delay $T_0$. Each of the control signals SQWV1 and SQWV2 is a 50% duty cycle squave wave having a cycle time $T_p = 4T_0$.

The controls signals SQWV1 and SQWV2 are illustrated in FIG. 4B. Since the control signal delay for switching device 66 is equal to the delay $T_0$ of optical fiber 65, switching device 66 turns on at the same time as the input beam gated through switching device 64 reaches the downstream switching device 66. The timing of the control signals SQWV1 and SQWV2 prevents a light beam from passing in the reverse direction through the isolator of FIG. 4A. The output of switching device 66 is illustrated in 4B. The duty cycle of the isolator output is 50% due to the square wave control signals. An isolator which provides a 100% duty cycle output is illustrated in FIG. 5 and described hereinafter.

The 50% duty cycle modulator is particularly useful in establishing two-way communications on a single channel frequency. Thus, with reference to FIG. 4B, A can transmit to B during the positive portions of the output signal, while B can transmit to A during the low portions of the output signal when A cannot transmit. This effectively produces time multiplexing over a single channel frequency with full isolation.

In the case of the isolator shown in FIG. 4A, which has a 50% output duty cycle, the channel bandwidth requirement can be limited by passing the isolator output through a lowpass filter. The result is that the pulses are widened to fill up the available time slots and the bandwidth of the signal is reduced.

Figure 5:
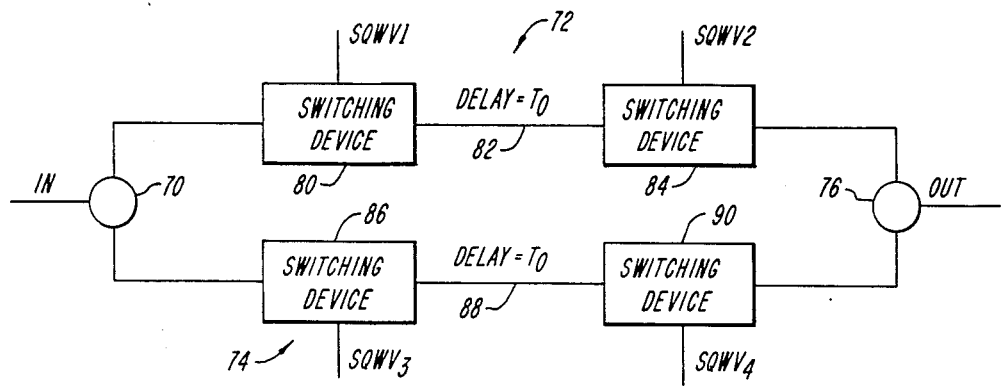
FIG. 5 is a block diagram of another embodiment of an optical isolator in accordance with the present invention.

Another embodiment of an optical isolator utilizing time gating of the light beam is shown in FIG. 5. This embodiment provides a 100% duty cycle output. An input light beam is divided equally by a beam splitter 70 such as a a phase matched lateral tap. One output from the beam splitter 70 is provided to a first channel 72, and the other output from the beam splitter 70 is provided to a second channel 74. The first channel 72 and the second channel 74 are coupled in parallel, and their outputs are combined in a power combiner 76 to provide an output light beam. In the first channel 72, the one output of beam splitter 70 is coupled to the input of an electronically controlled optical switching device 80. The output of switching device 80 is coupled by an optical fiber 82 to the input of an electronically controlled optical switching device 82. The output of switching device 82 is coupled to one input of power combiner 76. In the second channel 74, the other output of beam splitter 70 is coupled to the input of an electronically controlled optical switching device 86. The output of switching device 86 is coupled by an optical fiber 88 to the input of an electronically controlled optical switching device 90. The output of switching device 90 is coupled to the other input of power combiner 76. The optical fibers 82, 88 have prescribed equal lengths, and each fiber has an associated propagation delay $T_0$.

The switching devices 80, 84, 86 and 90 can be any suitable optical switching device, but are preferably a laser diode modulator as shown in FIGS. 2 and 3 and described hereinabove. Each of the switching devices 80, 84, 86, 90 includes a control lead to which is applied a control signal. In order to obtain the optical isolation feature, properly timed control signals are applied to each of the control leads. The control signals for switching devices 80, 84, 86, 90 are designated as SQWV1, SQWV2, SQWV3 and SQWV4, respectively, as shown in FIG. 5. Each of the control signals is a 50% duty cycle square wave having a cycle time $T_p = 4T_0$.

Figure 7:
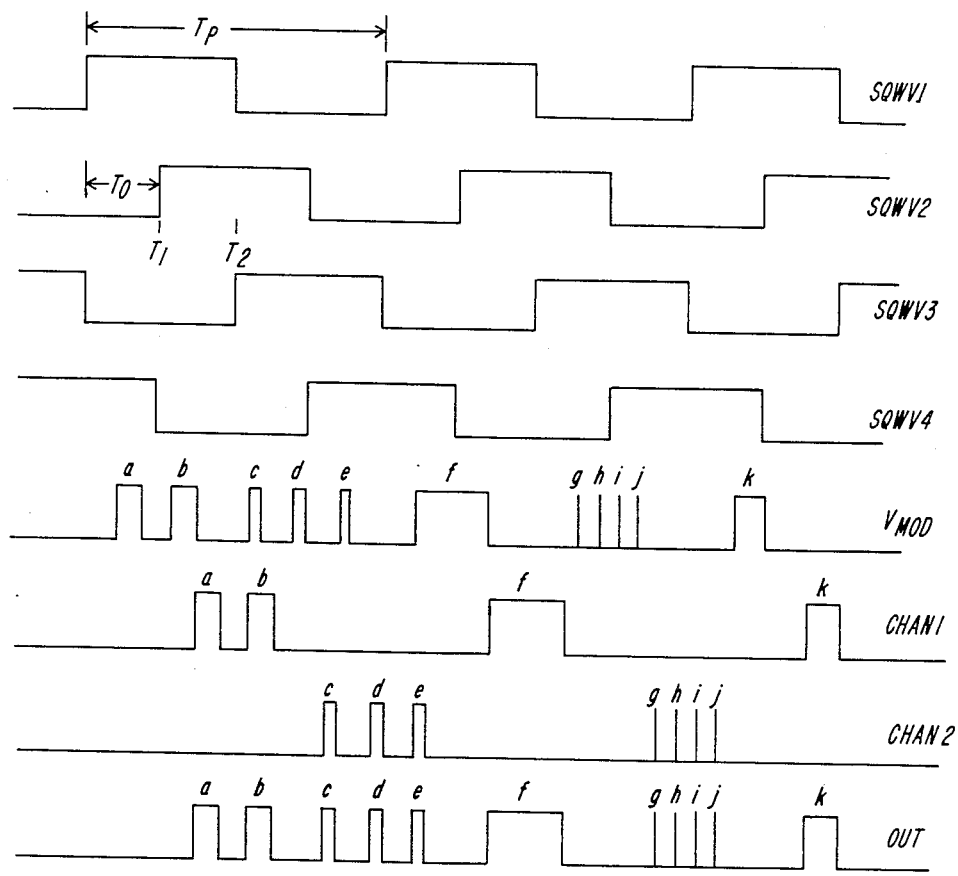
FIG. 7 illustrates waveforms associated with the operation of the apparatus shown in FIGS. 5 and 6.

The control signals SQWV1–SQWV4 are illustrated in FIG. 7. A high level control signal is arbitrarily designated as causing the corresponding switching device to turn on. SQWV1 and SQWV3, which are applied to switching devices 80 and 86, respectively, are out of phase by one-half cycle time $= T_p/2$. Therefore, switching device 80 is on while switching device 86 is off, and vice versa. It is further noted that control signal SQWV2 is delayed by a time $T_0$ relative to control signal SQWV1 and control signal SQWV4 is delayed by a time T0 relative to control signal SQWV3. Since the control signal delays for switching devices 84 and 90 are equal to $T_0$, these switching devices close at the same time as the input beam, which is gated through switching devices 80, 86, reaches the downstream switching devices 84, 90. An input light beam is time multiplexed through the first channel 72 and the second channel 74 and is recombined at the output to form a continuous output light beam that is the same as the input beam.

By contrast, a light beam attempting to pass in reverse direction through the isolator is blocked by the combination of time gated switching devices. For example, assume that a reverse light beam is applied to the output of the apparatus shown in FIG. 5 at time $T_1$ (FIG. 7). Since switching device 84 is on at time $T_1$, the reverse signal passes through switching device 84 and through optical fiber 82 to switching device 80. However, because of the delay $T_0$ through optical fiber 82, the reverse signal does not reach switching device 80 until time $T_2$. At time $T_2$, switching device 80 is turned off by control signal SQWV1, thereby causing the reverse signal to be blocked from passing to the input. A similar analysis will show that any reverse light beam is blocked from reaching the input of the optical isolator.

Figure 6:
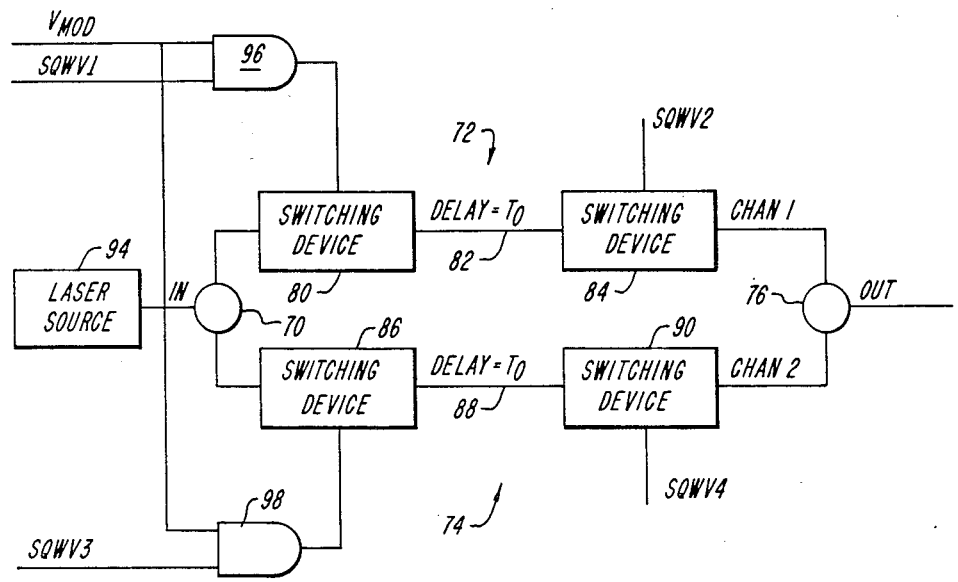
FIG. 6 is a block diagram of a modulated optical source in accordance with the present invention.

The optical isolator shown in FIG. 5 can be modified to provide a modulated optical source incorporating an isolation function, as shown in FIG. 6. Like elements in FIGS. 5 and 6 have the same reference numerals. A laser source 94 has its output coupled to the input of power splitter 70. The control signal SQWV1 is applied to one input of a logic gate 96. The other input of logic gate 96 receives the modulation signal $V_{MOD}$, and the output of gate 96 is connected to the control input of switching device 80. The control signal SQWV3 is connected to one input of a logic gate 98. The modulation signal $V_{MOD}$ is coupled to the other input of gate 98, and its output is coupled to the control input of switching device 86. The control signals SQWV1–SQWV4 have the same time relationship as described hereinabove and shown in FIG. 7.

The output of gate 96 is the modulation signal $V_{MOD}$ gated on and off by the square wave control signal SQWV1. Similarly, the output of gate 98 is the modulation voltage $V_{MOD}$ gated on and off by the square wave control signal SQWV3. As a result, the light beam from source 94 is alternately modulated in first channel 72 and in second channel 74. The output of first channel 72 is designated in FIG. 7 as CHAN1, and the output of second channel 74 is designated as CHAN2. An exemplary modulation signal $V_{MOD}$ is shown in FIG. 7. The modulation signal $V_{MOD}$ includes pulses a–k. The pulses a, b, f and k are gated by control signals SQWV1 and SQWV2 through first channel 72 and appear as shown in the CHAN1 signal, delayed by $T_0$ relative to modulation signal $V_{MOD}$. Pulses c, d, e, g, h, i, j are gated by control signals SQWV3 and SQWV4 through second channel 74 and appear as shown in the CHAN2 signal, delayed by $T_0$ relative to modulation signal $V_{MOD}$. The two channel outputs CHAN1 and CHAN2 are combined by power combiner 76 to provide the output modulated light beam as shown in FIG. 7 which is a reconstruction of the modulation signal delayed by $T_0$. It will be understood that system delays other than the delays of fibers 82 and 88 have been ignored in the present discussion for simplicity.

Figure 8:
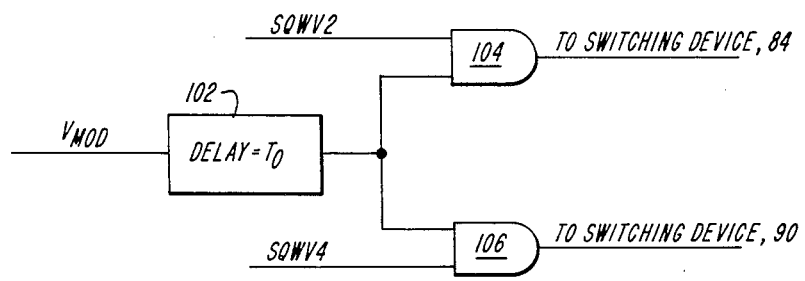
FIG. 8 is a schematic diagram illustrating a variation of the modulated optical source of FIG. 6.

It will be understood that the technique described above wherein a modulation signal $V_{MOD}$ is gated with the control signals of the isolator can be applied to the 50% duty cycle isolator shown in FIG. 4A and described hereinabove. In a variation of the modulation technique, the modulation signal $V_{MOD}$ is delayed and gated with the control signal applied to the downstream switching device in the optical isolator. This technique is illustrated in schematic form in FIG. 8 which shows the circuitry required to be added to the isolator of FIG. 6 to implement the alternate technique. The modulation signal $V_{MOD}$ is coupled to the input of a delay circuit 102 having a delay $T_0$ equal to the delay $T_0$ of optical fibers 82 and 88. The output of delay circuit 102 is coupled to one input of a gate 104 and to one input of a gate 106. Control signal SQWV2 is coupled to another input of gate 104, and the control signal SQWV4 is coupled to another input of gate 106. The output of gate 104 is coupled to the control input of switching device 84, and the output of gate 106 is coupled to the control input of switching device 90. With this arrangement, the switching devices 84 and 90 are modulated with the same modulating signals used to modulate switching devices 80 and 86, respectively. The advantage of this arrangement is that the output signals are made sharper and cleaner. The double modulation technique reduces the effects of the time constant of either switching device working alone. It will be understood that the double modulation technique can also be applied to the isolator shown in FIG. 4A and described hereinabove.

Preferably, switching devices 80, 86 are operated with an adequate modulation ratio but the lowest tolerable gain. Switching devices 84, 90 also have good modulation ratios, but are operated with enough gain so that the total gain produced by each channel meets the system requirements. In this way, low gain switching devices 80 and 86 shield the source 94 from inadvertent back-reflected power. Utilizing the same technique, the gain of switching device 64 in FIG. 4A is preferably relatively low, while the gain of switching device 66 is relatively high.

While there has been shown and described what is at present considered the preferred embodiments of the present invention, it will be obvious to those skilled in the art that various changes and modifications may be made therein without departing from the scope of the invention as defined by the appended claims.

What is claimed is:

1. An optical isolator for transmitting a forward light beam from an input to an output and for blocking a reverse light beam from passing from the output to the input, comprising:

first electronically controllable optical switching means coupled to said isolator input;

second electronically controllable optical switching means coupled to said isolator output;

means for optical coupling between said first switching means and said second switching means and having an associated delay $T_0$; and means for providing a first square wave actuation signal to said first switching means and for providing a second square wave actuation signal to said second switching means, said first and second square wave signals each having a cycle time $T_p = 4T_0$ and said second square wave signal being delayed relative to said first square wave signal by a time $T_0$.

2. An optical isolator as defined in claim 1 wherein said first switching means and said second switching means each comprise a laser diode modulator having an active region with optically flat faces at opposite ends thereof, means for suppressing oscillation of said laser diode and means for applying an electrical modulation signal to said active region.

3. An optical isolator as defined in claim 1 further including means for gating a digital modulation signal with the first square wave signal provided to the first switching means so that said forward light beam is modulated by said digital modulation signal.

4. An optical isolator as defined in claim 3 further including
means for delaying said digital modulation signal by $T_0$ to provide a delayed modulation signal, and
means for gating said delayed modulation signal with said second square wave signal.

5. An optical isolator as defined in claim 1 wherein said first switching means has a relatively low gain and said second switching means has a relatively high gain.

6. An optical isolator for transmitting a forward light beam from an input to an output and for blocking a reverse light beam from passing from the output to the input, comprising:
a first channel and a second channel coupled in parallel between the input and the output, each channel comprising
first electronically controllable optical switching means coupled to said isolator input;
second electronically controllable optical switching means coupled to said isolator output;
means for optical coupling between said first switching means and said second switching means and having an associated delay $T_0$; and
means for providing a first square wave actuation signal to said first switching means and for providing a second square wave actuation signal to said second switching means, said first and second square wave signals each having a cycle time $T_p = 4T_0$ and said second square wave signal being delayed relative to said first square wave signal by a time $T_0$; and
synchronizing means for providing said square wave signals to the respective first switching means of said first and second channels with a phase difference of one half cycle time $T_p/2$, whereby said forward light beam is continuously transmitted between said input and said output.

7. An optical isolator as defined in claim 6 wherein said first switching means and said second switching means each comprise a laser diode modulator having an active region with optically flat faces at opposite ends thereof, means for suppressing oscillation of said laser diode and means for applying an electrical signal to said active region.

8. An optical isolator as defined in claim 6 further including means for gating a digital modulation signal with the square wave signals provided to the first switching means of said first and second channels so that said forward light beam is modulated by said digital modulation signal.

9. An optical isolator as defined in claim 8 further including
means for delaying said digital modulation signal by $T_0$ to provide a delayed modulation signal, and
means for gating said delayed modulation signal with the square wave signals provided to the second switching means of said first and second channels.

10. An optical isolator as defined in claim 6 wherein each of said first switching means has a relatively low gain and each of said second switching means has a relatively high gain.

11. A modulated optical source for providing a light beam modulated by a digital modulation signal comprising:
source means for generating the light beam; and
a unidirectional optical modulator having an input for receiving said light beam from said source means, and an output, said modulator comprising
a first channel including a first electronically controllable optical switching means coupled to said modulator input, a second electronically controllable optical switching means coupled to said modulator output and first coupling means for optical coupling between said first and second switching means and having an associated delay $T_0$,
a second channel coupled in parallel with said first channel between said modulator input and output and including a third electronically controllable optical switching means coupled to said modulator input, a fourth electronically controllable optical switching means coupled to said modulator output and second coupling means for optical coupling between said third and fourth switching means and having an associated delay $T_0$,
means for providing a first square wave signal to said first switching means, a second square wave signal to said second switching means, a third square wave signal to said third switching means, and a fourth square wave signal to said fourth switching means, said square wave signals each having a cycle time $T_p = 4T_0$, said third square wave signal being delayed relative to said first square wave signal by one half cycle time $T_p/2$ and said second and fourth square wave signals being delayed relative to said first and third square wave signals, respectively, by $T_0$, and
means for gating said digital modulation signal with said first square wave signal and with said third square wave signal so that said first switching means is on only when said digital modulation signal and said first square wave signal are active and said third switching means is on only when said digital modulation signal and said third square wave signal are active.

12. A modulated optical source as defined in claim 11 wherein said switching means each comprise a laser diode modulator having an active region with optically flat faces at opposite ends thereof, means for suppressing oscillation of said laser diode and means for applying an electrical signal to said active region.

13. A modulated optical source as defined in claim 11 further including
   means for delaying said digital modulation signal by $T_0$ to provide a delayed modulation signal, and
   means for gating said delayed modulation signal with said second square wave signal and for gating said delayed modulation signal with said fourth square wave signal so that modulated control signals are provided to said second and fourth switching means.

14. A modulated optical source as defined in claim 11 wherein said first and third switching means have relatively low gains and said second and fourth switching means have relatively high gains.

* * * * *